(12) United States Patent
Sutterlin et al.

(10) Patent No.: US 6,636,117 B2
(45) Date of Patent: Oct. 21, 2003

(54) INPUT/OUTPUT BUFFER INCORPORATING FILTER FOR POWERLINE COMMUNICATIONS LINE

(75) Inventors: Philip H. Sutterlin, Saratoga, CA (US); Walter J. Downey, Los Gatos, CA (US)

(73) Assignee: Echelon Corporation, San Jose, CA (US)

( * ) Notice: Subject to any disclaimer, the term of this patent is extended or adjusted under 35 U.S.C. 154(b) by 0 days.

(21) Appl. No.: 10/040,408

(22) Filed: Dec. 28, 2001

(65) Prior Publication Data

US 2003/0122625 A1 Jul. 3, 2003

(51) Int. Cl.[7] .................................................. H03F 3/18
(52) U.S. Cl. .................... 330/267; 330/51; 330/120; 330/265; 330/267; 330/268
(58) Field of Search .................... 330/51, 110, 265, 330/267, 268

(56) References Cited

U.S. PATENT DOCUMENTS

| | | | | |
|---|---|---|---|---|
| 4,540,951 A | * | 9/1985 | Ozawa et al. | ............... 330/267 |
| 4,570,128 A | * | 2/1986 | Monticelli | ................... 330/267 |
| 4,791,383 A | * | 12/1988 | Monticelli et al. | .......... 330/265 |
| 5,241,283 A | * | 8/1993 | Sutterlin | ...................... 330/51 |
| 5,510,754 A | * | 4/1996 | Moraveji et al. | ........... 330/267 |
| 5,512,859 A | * | 4/1996 | Moraveji | .................... 330/267 |
| 5,786,731 A | * | 7/1998 | Bales | ......................... 330/267 |
| 6,166,603 A | * | 12/2000 | Smith | ......................... 330/263 |
| 6,236,273 B1 | * | 5/2001 | Lewyn | ....................... 330/297 |

OTHER PUBLICATIONS

Sutterlin Philip H., "Drive amplifier for power line communications" Nov. 26, 1992, PCT, International publication No. WO 92/21177.*

* cited by examiner

*Primary Examiner*—Michael Tokar
*Assistant Examiner*—Khai Nguyen
(74) *Attorney, Agent, or Firm*—Blakely, Sokoloff, Taylor & Zafman LLP

(57) ABSTRACT

An improvement in a buffer for driving a signal onto a power line is described. The buffer includes a second order filter. With the improvement, the collector-to-emitter potential of an emitter follower is maintained constant to substantially reduce the distortion associated with base-collector capacitance.

18 Claims, 4 Drawing Sheets

INPUT/OUTPUT BUFFER INCORPORATING FILTER FOR POWERLINE COMMUNICATIONS LINE

FIELD OF THE INVENTION

The invention relates to amplifiers and buffers, particularly for driving a signal onto a power line.

PRIOR ART

The present invention is an improvement of an amplifier disclosed in U.S. Pat. No. 5,241,283 which is discussed in conjunction with FIGS. 1 and 2 of this application.

SUMMARY OF THE INVENTION

An improvement in a input/output buffer for transmitting a communication signal over a power line is described. The buffer includes a transmit filter which receives an input from a digital-to-analog converter. The output stage of the buffer has a first pair of emitter followers for driving an output in a first direction and a second pair of emitter followers for driving the output in the opposite direction. The improvement of the present invention comprises maintaining the collector-to-emitter voltage constant without degrading the ability to provide an output signal nearly equal to the supply potential. This substantially reduces the distortion associated the prior art amplifier.

DETAILED DESCRIPTION

An improvement in a power line communications buffer/amplifier for providing signal transmission across a power line is described. In the following description, numerous specific details are set forth such as specific transistor types in order to provide a thorough understanding of the present invention. It will be apparent to one skilled in the art that the present invention may be practiced without these specific details.

Prior Art

The present invention is an improvement of the amplifier shown in FIG. 6 of U.S. Pat. No. 5,241,283 ('283 patent). In order to provide an understanding of the improvement, it will be helpful to understand this prior art amplifier. For this reason, FIGS. 1 and 2 in this application are the same as FIGS. 6 and 7 of the '283 patent. The following description for FIGS. 1 and 2 is taken from the '283 patent, except that the figure numbers have been changed.

Figure 1:
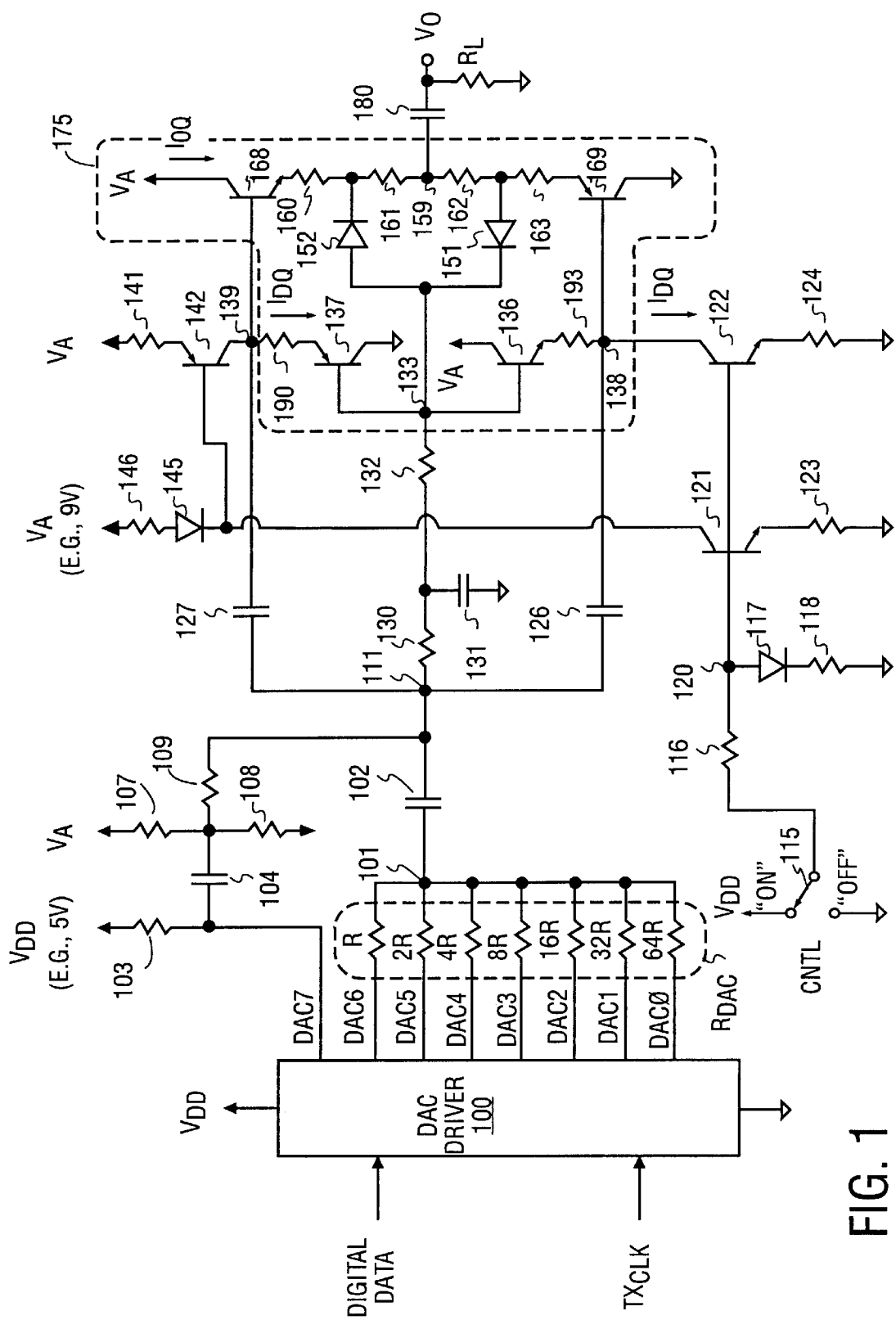
FIG. 1 illustrates prior art and is a reproduction of FIG. 6 of U.S. Pat. No. 5,241,283.
Figure 2:
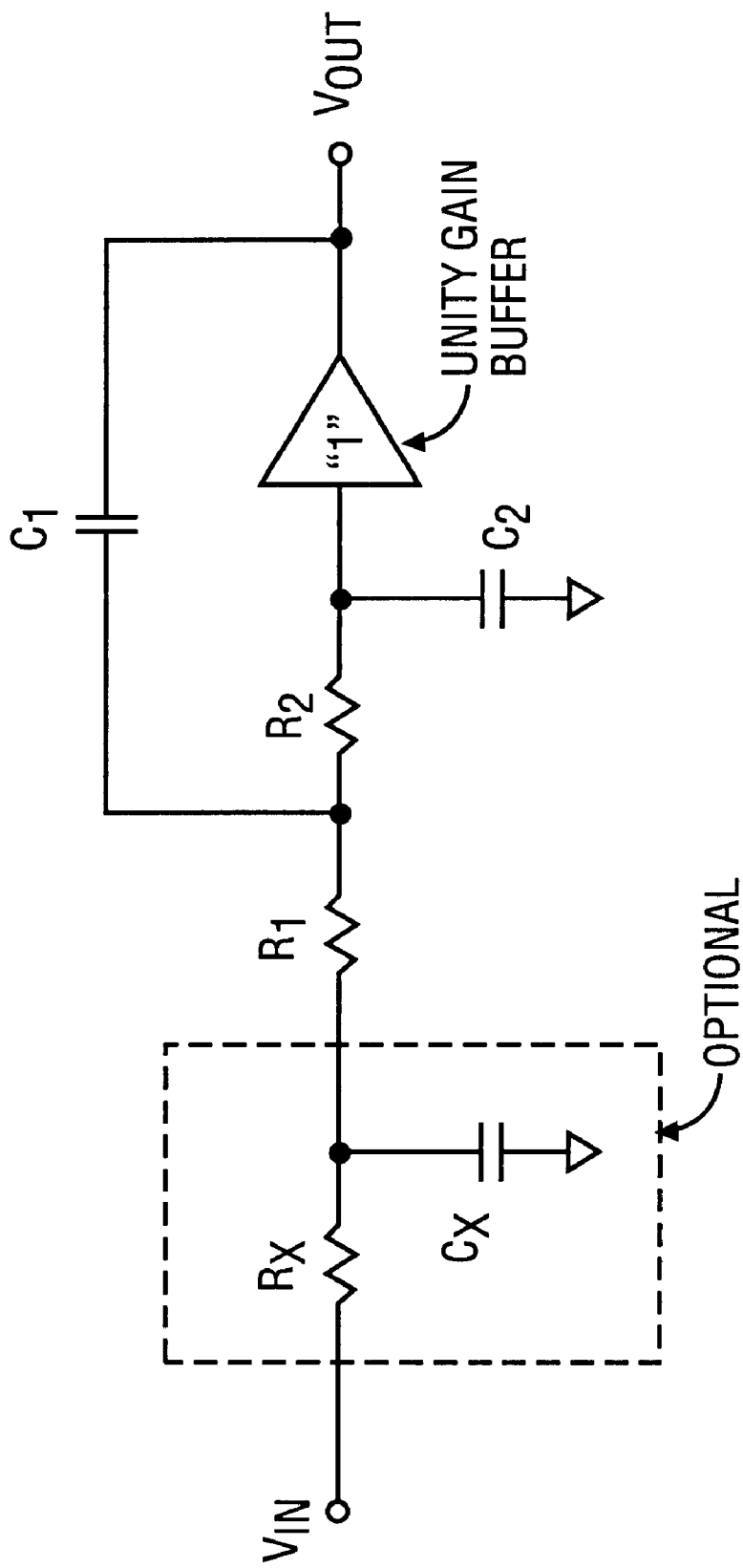
FIG. 2 is a reproduction of FIG. 7 of U.S. Pat. No. 5,241,283.

An alternative solution to the problem of driving communications signals onto power lines is provided by the circuit schematic of FIG. 1. Like the previous embodiments, the amplifier of FIG. 1 provides a means for presenting a high impedance to the power line while operating in a receive mode. On the other hand, when transmitting, the amplifier is characterized by a very low output impedance. In addition, digital control circuitry is provided to facilitate rapid switching between transmit and receive modes of operation.

To begin with, the amplifier of FIG. 1 has an output stage which comprises a unity gain buffer 175 coupled between a supply voltage $V_A$ (e.g., 9 volts) and ground. Buffer 175 provides an output signal at node 159 which is then coupled through capacitor 180 to a suitable power line coupling circuit. For ease of understanding, the amplifiers' output signal $V_O$ is shown across a load resistance $R_L$ which represents the equivalent impedance of the coupling circuit and the power line.

Unity gain buffer 175 includes a pair of up/down transistors configured to provide large amounts of current into output node 159. At the same time, this configuration produces a relatively high impedance looking back into the amplifier form the power line when switch 115 is in the "off" position. The up/down configuration in the top half of buffer 175 comprises the combination of PNP transistor 137 and NPN transistor 168. Both of these transistors are configured as emitter followers, with the emitter of transistor 137 (through resistor 190) and the base of transistor 168 both being coupled to node 139. The emitter of transistor 168 both being coupled through series resistors 160 and 161 to output node 159. These resistors have relatively small resistance values so that the signal voltage drop across them is negligible. This means that the potential at node 133 (coupled to the base of transistor 137) is essentially the same as the potential produced at node 159 during normal transmit operations.

Similarly, NPN transistor 136 has its base coupled to node 133 and its emitter coupled to node 138 (through resistor 193). Node 138 is coupled to the base of PNP transistor 169, which has its emitter coupled to output node 159 through series resistors 162 and 163. Transistors 142 and 122—together with resistors 141 and 124—provide a source of current for driving buffer 175.

Altogether, components 115–124 and 141–146 comprise a biasing network coupled to unity gain buffer 175. When digital switch 115 (which may comprise an ordinary field-effect digital gate) is in its "on" position, supply potential $V_{DD}$ is coupled to node 120 through resistor 116. This establishes a reference voltage on the bases of transistors 121 and 122. Collectively, devices 116–124 act as a current mirror supplying bias current to transistor 136 and the other current mirror comprising devices 141–146, which in turn provide bias current to transistor 137. Devices 141, 142, 145, and 146 function as a current mirror such that a constant current is provided for transistors 136 and 137. Thus, with switch 115 in its "on" position, unity gain buffer 175 is activated.

In the opposite case, when switch 115 is in its "off" position, node 120 is grounded. This turns off transistors 121 and 122 and also transistor 142. The result is that no drive current is available for buffer 175 and the emitter follower configuration of the up/down transistor pairs simply presents a high impedance to the power line. Practitioners in the art will appreciate that with switch 115 "off", the unity gain buffer configuration shown in FIG. 1 presents a very high impedance looking back into node 159 (ignoring diodes 151 and 152 for the time being). This up/down configuration also provides high current driving capability so that the invented circuit is capable of transmitting a signal of approximately several hundred milliwatts of power.

Diodes 151 and 152 are incorporated into the basic buffer circuit of FIG. 1 in order to prevent high currents from destructively breaking down the output stage transistors. During its receive mode of operation, the amplifier of FIG. 1 must be capable of withstanding unattenuated signal voltage swings which appear on the power line. These voltage swings could possibly destroy the output stage transistors by means of high reverse base/emitter breakdown current. To guard against this possibility, diodes 151 and 152 are included.

During normal transmit operation the voltage on node 133 is approximately equal to the voltage on node 159, so that no current flows through either diodes 152 or 151. In receive mode of operation, however, buffer 175 is disabled and the voltage $V_o$ can swing across the full operating potential. But as soon as the voltage at node 159 deviates from the voltage at node 133 by more than ~0.7 volts, one of the two diodes 151 or 152 will begin to conduct. Thus, potentially destructive reverse breakdown current is shunted away from the output bipolar transistors.

High impedance at node 133 (as seen looking back toward the input) is further preserved by means of a digital-to-analog converter (DAC) comprising a standard binary-weighted string of resistors coupled in parallel to convert a digital representation of the transmit signal into an analog signal at node 111. The DAC resistors are driven by a DAC driver circuit 100 which provides an appropriate voltage to the respective DAC lines, e.g., DAC0-7. Driver 100 also includes circuitry for synchronizing the individual input lines of an 8-bit input digital signal to a clock signal. In a current embodiment, DAC driver 100 comprises part no. XC3042PC84-100 manufactured by XILINX Corporation (now using Echelon Model #EC15203A).

The use of a digitally-controlled input signal is important in the present invention because it provides an additional means of establishing a high receive mode input impedance at node 133. DAC 100 has a thevenin equivalent impedance that represents the parallel combination of all of its resistors. Because the circuit of FIG. 1 is driven digitally, this digital circuitry can be tri-stated to create a high impedance looking back into node 133. Thus, a high output impedance is achieved in the "off" or receive mode of operation by debiasing the emitter follower output stage by means of digital switch 115, and also by tri-stating the digital drive circuitry of DAC 100. At the same time, diodes 151 and 152 perform the dual function of protecting the emitter follower base emitter junctions from reverse breakdown in receive mode while limiting the output current to protect against shorts while in transmit mode. By way of example, if $R_L=0$ (i.e., a short), then buffer 175 would attempt to supply an infinite current at its output—limited only by the available base drive current for transistors 168 and 169 the beta of these transistors and the very low impedance of resistors 160–163. On the other hand, the inclusion of diodes 151 and 152 provides a more properly controlled current limit, wherein the source and sink peak currents through transistors 168 and 169 are limited to approximately 0.7 $V/R_{160}$ and 0.7 $V/R_{163}$, respectively.

In order to prevent transients from appearing at the amplifier's output while switching from transmit to receive modes (or vice-a-versa) the cumulative change on capacitors 102 and 104 is conserved. For example, consider the case where the circuit is switched from a transmit to a receive mode of operation. When operating in transmit mode (and just prior to switching) node 101 and the line labeled $DAC_7$ are both charged to one-half of the supply potential VDD (e.g., 2.5 V). In receive mode, however, (after switching) resistor 103 pulls the left plate of capacitor 104 up to $V_{DD}$, while the line labeled $DAC_0$ is pulled low. This grounds the left plate of capacitor 102. Thus, the cumulative charge on both capacitors is conserved. (Note that line $DAC_0$ is the only DAC output line which is not tri-stated in receive mode of operation.)

Note that the quiescent current $I_{DQ}$ is selected in the circuit of FIG. 1 such that there is sufficient base drive current available for transistors 168 and 169. In general, resistors 190 and 193 are selected such that the sum of resistors 160–163 ratioed against the sum of resistors 190 and 193 set an appropriate output quiescent current $I_{OQ}$ which achieves low distortion and meets FCC and other regulations.

Finally, the power line amplifier circuit of FIG. 1 also incorporates a important filter function for maintaining low distortion in the transmit signal. Low distortion and spurious filtering is critical if the power line amplifier is to meet stringent FCC regulations. Accordingly, the embodiment of FIG. 1 includes a Salen Key filter having a circuit configuration which is best illustrated by the schematic of FIG. 2. The Salen Key topology utilizes a unity gain buffer in conjunction with capacitors $C_1$ and $C_2$ and resistors $R_1$ and $R_2$, to provide a wide variety of filter functions. In the present invention, a second order filter is realized having a cut-off frequency point at approximately 400 KHz (now approximately 150 KHz). This operation is in accordance with the current use of the circuit of FIG. 1 in a spread spectrum communication system (now narrow band communication system) operating within the frequency range of approximately 100–400 KHz (now 70K–140 KHz). A third order Salen key filter can be realized by including the additional elements $R_x$ and $C_x$ as optionally shown in FIG. 2.

Viewing FIGS. 1 and 2 together, it can be seen that capacitor $C_1$ comprises the sum of capacitors 127 and 126, capacitor $C_2$ comprises capacitor 131, and resistor $R_2$ comprises resistor 130. Resistor R1of FIG. 2 comprises the parallel combination of resistors 109 and the seven other DAC resistors (i.e., R, 2R, 4R, 8R, 16R, 32R and 64R; collectively, $R_{DAC}$) in FIG. 1. Resistors 107 and 108 set the amplifier's bias voltage at one-half the supply voltage $V_A$ so that a balanced plus/minus swing is available.

One of the noteworthy features about the circuit of FIG. 1 is that it combines a second-order filter function with a "tri-stateable" unity gain output buffer wherein both share common components. Obviously, combining these two functions in a single circuit reduces the overall component count. The end result is an amplifier circuit providing a complex filter function while at the same time having the capability to drive large amounts of power onto the power lines at a minimum component cost.

Improvement of the Present Invention

One problem with the buffer/amplifier discussed above is that for some applications, there is too much distortion. This distortion results from the fact that the source of the input signal (digital-to-analog converter) and filter resistor 130 has significant impedance (mostly resistance) and the base-to-collector capacitance of transistors 136 and 137 varies as a function of a voltage across these terminals. As will be seen, the present invention solves this problem and as will be discussed in conjunction with FIG. 4, there is a reduction in distortion by a factor of 3 with a source impedance of approximately 6k ohms.

Prior art solutions for this problem lose "headroom," that is the output node cannot swing as close to the voltage supply potential, in fact, in some cases, one to two volts of signal swing may be lost. This is an unacceptable solution for many applications of driving a communication signal onto a power line.

With the present invention, the collector-to-base potential is maintained constant by keeping the collector-to-emitter potential essentially constant for a transistor in the emitter follower circuit. By doing this, the base-to-collector capacitance, which is a function of base collector voltage, remains essentially constant. This reduces the distortion discussed above.

Referring to FIG. 1, this can be achieved by simply connecting the collector of transistor 136 and the collector of transistor 137 to node 159. However, when this is done, the circuit does not maintain high output impedance in the "off" state for some conditions of signal presented to the amplifier output terminal. Alternatively, the collector of transistor 136 can be connected to the emitter of transistor 169, and the collector of transistor 137 can be connected to the emitter of transistor 168. Again, while this provides the result of keeping the collector-to-emitter potential constant, it does not maintain high output impedance in the "off" state for some conditions of signal presented to the amplifier output terminal.

Figure 3:
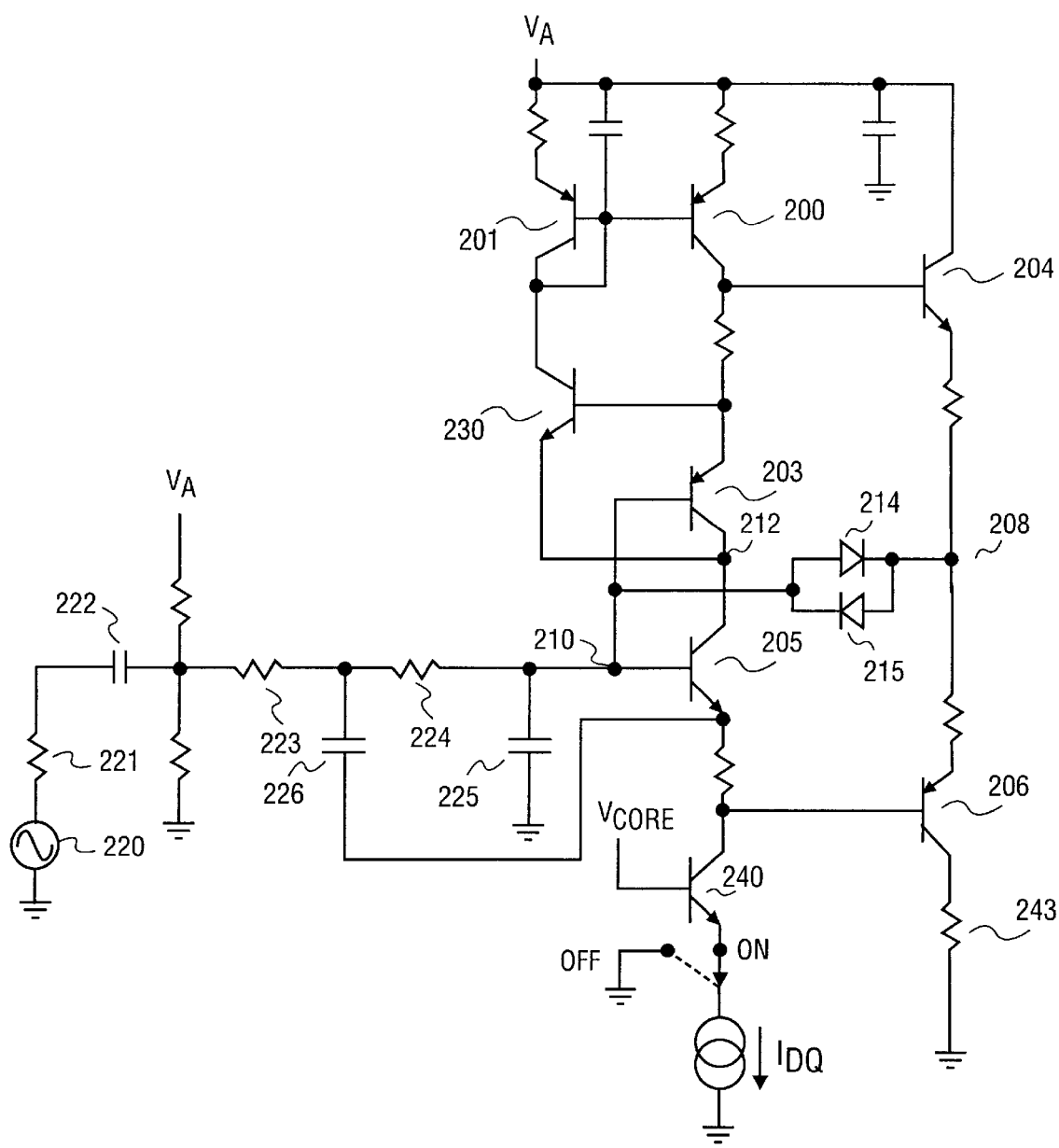
FIG. 3 is a schematic of the buffer of the present invention.

FIG. 3 illustrates an embodiment of the present invention where the collector to emitter potential is maintained constant by the addition of a transistor, specifically transistor 230, which has its base and emitter coupled across the emitter and collector, respectively, of the transistor 203.

Referring to FIG. 3, the buffer again includes a first pair forming an emitter follower; specifically PNP transistor 203 and NPN transistor 204 which are used to pull up the output node 208. A second pair of transistors form another emitter follower pair comprising NPN transistor 205 and PNP transistor 206. These are used to pull down the node 208. The bases of transistors 203 and 205 are coupled to the output of the filter, node 210. The filter comprises the resistors 223 and 224 and the capacitors 226 and 225. These components again form a second ordered filter as described in the '283 patent. For purposes of simplicity, the digital-to-analog (DAC) converter is represented simply as voltage source 220, and a single resistor 221. This resistance, of course, changes depending upon the output state of the DAC. Capacitor 222 provides AC coupling.

With the improvement of the present invention, the collectors of transistors 203 and 205 are connected to a common node 212. The base of an NPN transistor 230 is coupled to the emitter of transistor 203. The emitter of transistor 230 is coupled to node 212. The collector of transistor 230 is connected to a current mirror formed by the transistors 200 and 201.

Back-to-back diodes 214 and 215 connect nodes 208 and 210. The base of transistor 240 receives a constant low potential from the core of the integrated circuit that includes the DAC.

In the currently preferred embodiment, node 210 is laid out on a printed circuit board to be very short such that it is a low inductance trace and a low capacitance node. Additionally, transistors 203 and 204 are thermally coupled. Similarly, transistors 205 and 206 are thermally coupled.

Importantly, the transistor 230 provides compensation for what would otherwise be wider variations in the collector-to-base capacitance of transistors 203 and 205. It is the variation in this capacitance as mentioned above which is a major source of distortion in the amplifier. Importantly, this improved invention accomplishes stabilization of the collector base capacitance without degrading how close the amplifier output can swing toward the supply rails.

Figure 4:
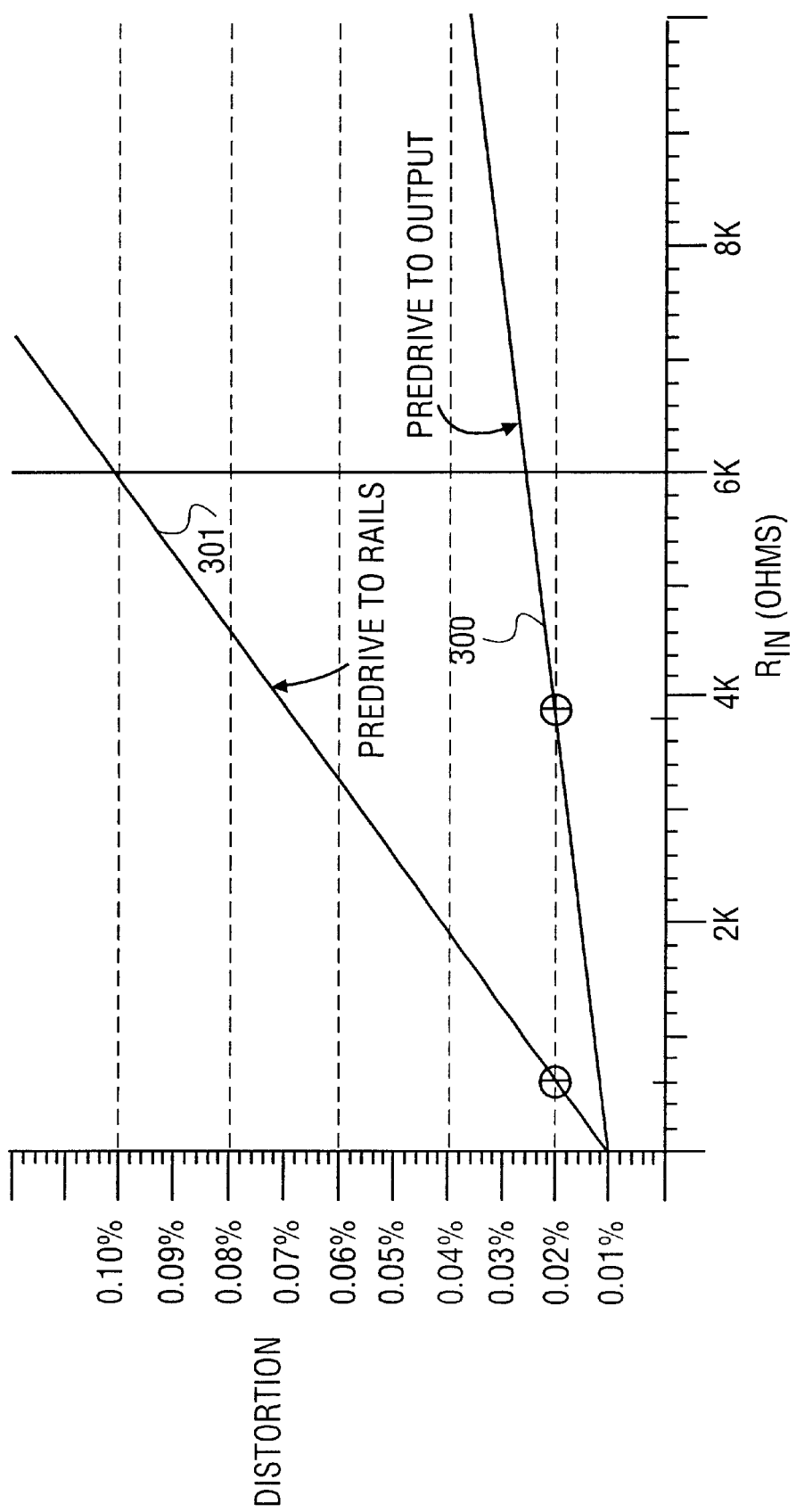
FIG. 4 is a graph used to illustrate the reduction in distortion obtained with the present invention.

Referring to FIG. 4, the improvement of the present invention when compared to the prior buffer of FIG. 1 is illustrated. In FIG. 4, distortion is plotted against source impedance feeding the input of the buffer. Line 301 represents the distortion for the buffer of FIG. 1 whereas line 300 shows the distortion for the buffer of FIG. 3. As can be seen, there is substantially less distortion for line 300. For instance, at a source impedance of 6KΩ, the distortion is reduced by a factor of 3.

Thus, an improved buffer with reduced distortion, particularly useful for driving power line, has been described.

What is claimed:

1. A method for reducing distortion in an emitter follower circuit where an input signal is coupled through resistance, comprising:

maintaining substantially constant a collector-to-emitter potential of a transistor in the emitter follower circuit in such a way that the output swing of the circuit is not degraded; and applying the input signal to the emitter follower circuit.

2. An emitter follower circuit including:

an input signal source for the circuit having resistance; and means for maintaining the collector-to-emitter potential of a first transistor substantially constant such that the input signal can drive an output signal where the means for maintaining the collector-to-emitter potential of the first transistor does not degrade how close to a power supply rail the output signal may drive.

3. The circuit defined by claim 2, including a second transistor with a base coupled to an emitter of the first transistor and an emitter of the second transistor coupled to a collector of the first transistor.

4. The circuit defined by claim 3, wherein the first and second transistors are of opposite conductivity type.

5. The circuit defined by claim 3, wherein the first transistor is a PNP transistor and the second transistor is an NPN transistor.

6. In an input/output buffer for transmitting a communication signal over a power line which can be turned off to produce a high impedance at its output and which includes a transmit filter and an output stage having a first pair of emitter followers for driving an output in a first direction and a second pair of emitter followers for driving the output in a second direction, an improvement comprising:

a transistor coupled between an emitter of one of the pairs of emitter followers to a common node formed by a collector of the first pair of the emitter followers and a collector of the second pair of the emitter followers.

7. The improvement defined by claim 6 wherein a base terminal of the transistor is coupled to the emitter of one of the pairs of emitter followers and an emitter of the transistor is coupled to the common node.

8. The improvement defined by claim 7 including back-to-back diodes coupled between an output node and an input node.

9. The improvement defined by claim 8 wherein the input to the transmit filter is from a digital-to-analog converter.

10. A buffer comprising:

a filter;

a first emitter follower pair comprising a first PNP transistor and a first NPN transistor;

a second emitter follower pair comprising a second NPN transistor and a second PNP transistor;

the base of the first PNP transistor and the base of the second NPN transistor being coupled to the filter;

the collector of the first PNP transistor and the collector of the second NPN transistor being connected to a common node;

a third NPN transistor having its base connected to the emitter of the first PNP transistor and its emitter connected to the common node.

11. The buffer defined by claim 10 including a diode connected between the common node and the emitter of the first NPN transistor and the emitter of the second PNP transistor.

12. The buffer defined by claim 11 wherein the filter is a second order filter.

13. The buffer defined by claim 12 including a digital-to-analog converter connected to an input of the filter.

14. The buffer defined by claim 11 including a fourth NPN transistor coupled to the emitter of the second NPN transistor for receiving a control signal for causing the buffer to have a high impedance at the emitters of the first NPN transistor and the emitter of the second PNP transistor.

15. The amplifier defined by claim 14 including a current source coupled to the emitter of the fourth NPN transistor.

16. A buffer comprising:

a filter;

a first emitter follower pair comprising a first PNP transistor and a first NPN transistor;

a second emitter follower pair comprising a second NPN transistor and a second PNP transistor;

the base of the first PNP transistor and the base of the second NPN transistor being coupled to the filter;

the collector of the first PNP transistor and the collector of the second NPN transistor being connected to a first node;

the emitter of the first NPN transistor and the emitter of the second PNP transistor being coupled to a second node; and the first and second nodes being connected.

17. A buffer defined by claim 16, wherein the filter is a second order filter.

18. The buffer defined by claim 17 including a digital-to-analog converter connected to an input of the filter.

* * * * *